United States Patent [19]
Iwaki

[11] Patent Number: 6,069,373
[45] Date of Patent: May 30, 2000

[54] COMPACT SEMICONDUCTOR DEVICE USING SOI•CMOS TECHNOLOGY

[75] Inventor: Hiroaki Iwaki, Tokyo, Japan

[73] Assignee: NEC Corporation, Tokyo, Japan

[21] Appl. No.: 09/098,864

[22] Filed: Jun. 17, 1998

[30]     Foreign Application Priority Data

Jun. 18, 1997   [JP]   Japan ................................... 9-161438

[51] Int. Cl.[7] ............................................... H01L 27/10
[52] U.S. Cl. ......................... 257/204; 257/206; 257/351; 257/371
[58] Field of Search ................................... 257/204, 206, 257/350, 351, 371, 374

[56]            References Cited

U.S. PATENT DOCUMENTS

| | | | |
|---|---|---|---|
| 3,999,214 | 12/1976 | Cass ............................................ | 357/45 |
| 4,771,327 | 9/1988 | Usui ............................................ | 357/45 |
| 4,870,471 | 9/1989 | Ohkura ....................................... | 357/42 |
| 5,031,018 | 7/1991 | Shirato et al. ............................. | 357/42 |
| 5,604,360 | 2/1997 | Zhang et al. .............................. | 257/72 |
| 5,744,822 | 4/1998 | Takayama et al. ........................ | 257/66 |
| 5,789,781 | 8/1998 | McKitterick ............................... | 257/347 |

*Primary Examiner*—Sara Crane
*Attorney, Agent, or Firm*—Laff, Whitesel & Saret, Ltd.; J. Warren Whitesel

[57]            ABSTRACT

A square measure of a basic cell and a basic circuit cell of a semiconductor device used a SOI•CMOS technology is reduced. In the semiconductor device used a SOI•CMOS technology, the basic cells constituted by two pieces of PMOS and two pieces of NMOS are arranged in order of the PMOS, the PMOS, the NMOS and NMOS or NMOS, the NMOS, the PMOS and the PMOS in a row, and the diffused layer of a portion on which the PMOS and the NMOS adjoin are formed in a manner to adjoin directly. Moreover, the power source wiring and the grounding wiring are arranged around the basic cell in a manner to being held in common with the adjacent cells, and at least one of PMOS diffused layers is arranged so as to be able to be connected with a power source wiring through a contact directly and at least one of NMOS diffused layers is arranged so as to be able to be connected with a grounding wiring through a contact directly.

3 Claims, 8 Drawing Sheets

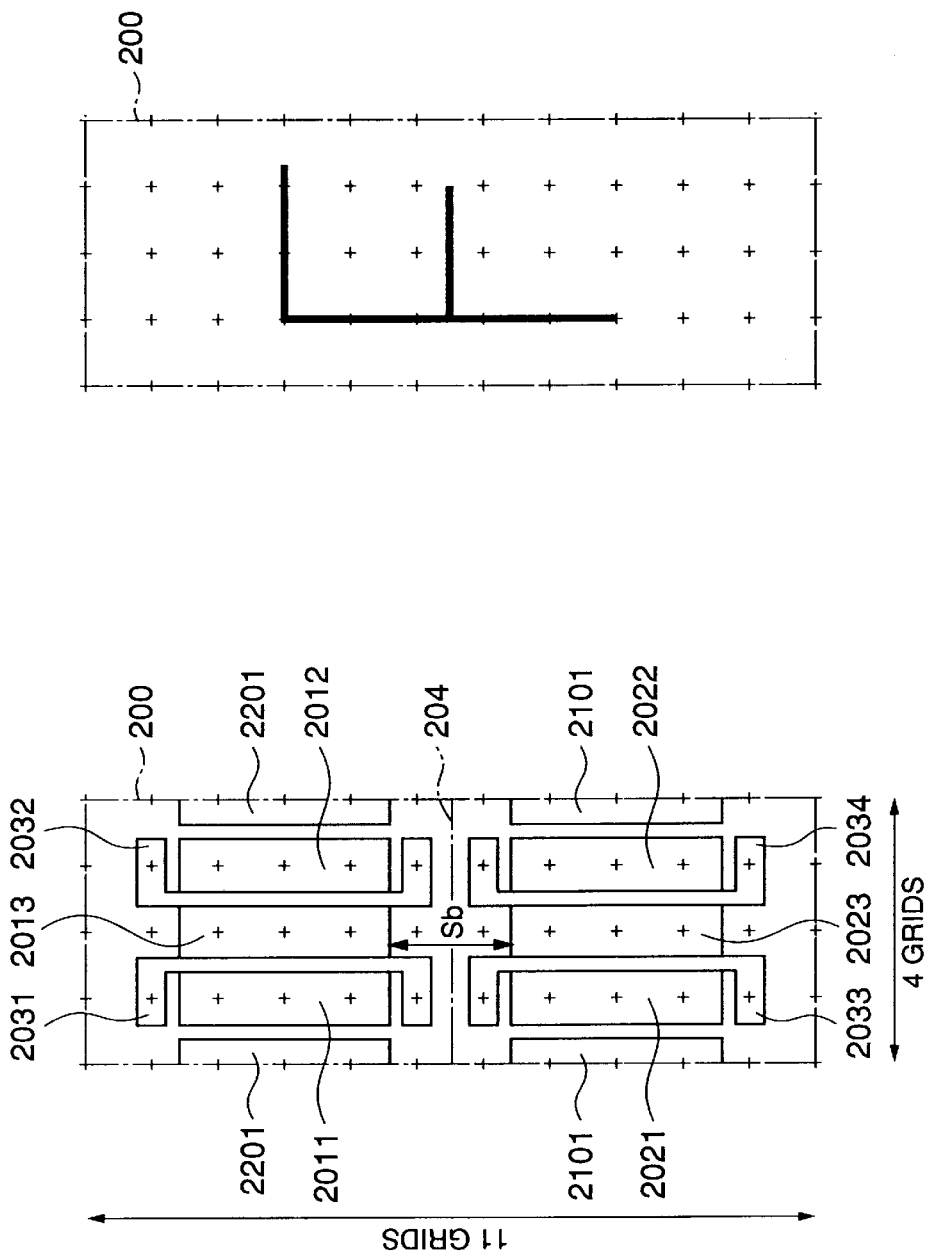

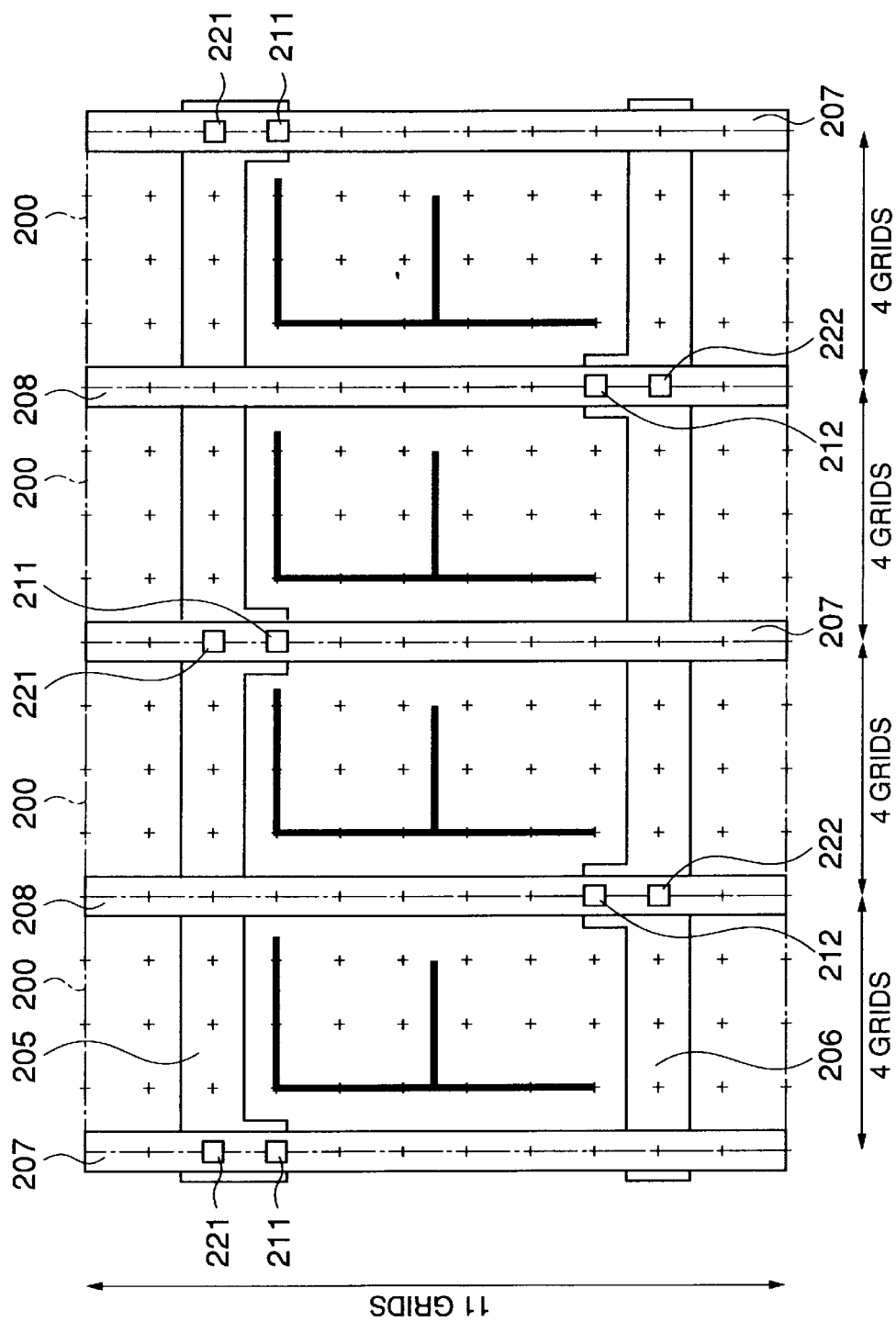

COMPACT SEMICONDUCTOR DEVICE USING SOI•CMOS TECHNOLOGY

BACKGROUND OF THE INVENTION

This invention relates to a semiconductor device formed on a principal surface of a semiconductor substrate provided with a silicon/isolation film structure (hereinafter referred to as SOI), and more particularly to a layout constitution of a basic cell constituting an internal circuit of the semiconductor device.

In general, in a method for acquiring an large scale integration circuit (LSI), there is a full custom system that function and performance are taken seriously and a semicustom system that a general purpose property and a short TAT are taken seriously. The semi-custom system is such a system that a part of a component of the LSI is prepared in advance and a chip designer performs remaining designs based on a circuit design information from an LSI designer. The LSI having the desired functions is thereby achieved. This technique is used widely, since the number of manpower required in manual designs can be so reduced. Typical examples in which the technique is used are a gate array, an embedded array and a standard cell.

For both of the aforesaid systems, a library for the LSI designer of various circuit blocks and a library for the chip designer are prepared in advance based on a basic cell defining a transistor or a logic gate as a minimum unit. The LSI designer designs an aimed LSI circuit by the use of this library, and the chip designer performs the above-mentioned remaining designs based on this design information and the library for the LSI designer. Accordingly, the LSI having the desired functions is achieved. In the gate array and the embedded array, the basic cell defining the aforesaid transistor or logic gate as the minimum unit is built-in on the chip in advance. Consequently, it becomes possible to develop the LSI within the short TAT more efficiently.

In these semi-custom systems, the development of the LSI using the LSI component prepared in advance only is performed to obtain an advantageous merit in the general purpose and a development of the short TAT. However, a square measure of the chip tends to become large in some cases. Therefore, it is extremely important to reduce the square measure of the chip by reducing a square measure of the basic cell.

As a method for reducing such a square measure of the basic cell, a CMOS technology using a silicon/the isolation film structure (hereinafter referred to as a SOI•CMOS technology) is proposed. However, as will later be described more in detail, the problem is not solved sufficiently even by the proposed SOI•CMOS technology.

SUMMARY OF THE INVENTION

Therefore, it is an object of the present invention to provide a semiconductor device capable of reducing a square measure of a basic cell constituting an internal circuit of the semiconductor device using the SOI•CMOS technology.

Other objects of the present invention will become clear as the description proceeds.

On describing the gist of the present invention, it is readily understood that a semiconductor device is formed on a principal surface of a semiconductor substrate provided with a silicon/isolation film structure and that the semiconductor device includes a basic cell constituting an internal circuit of the semiconductor device.

According to an aspect of the present invention, there is provided a semiconductor device comprising: two PMOS transistors; and two NMOS transistors, when a side of the semiconductor device is defined as the direction of the x-axis, a side of the direction at the right angle to this side is defined as the direction of the y-axis and the direction of a gate width (W) of the PMOS and NMOS transistors is defined as the direction of the y-axis, the two PMOS transistors and the two NMOS transistors being arranged in a row in the direction of the x-axis in order of a first arrangement of a first PMOS transistor, a second PMOS transistor, a first NMOS transistor and a second NMOS transistor or in order of a second arrangement of a third NMOS transistor, a fourth NMOS transistor, a third PMOS transistor and a fourth PMOS transistor, and when being the order of the first arrangement, the one diffused layer of the second PMOS transistor and the one diffused layer of the first NMOS transistor being formed in a manner to adjoin directly to form a diffused layer region integrated, and when being the order of the second arrangement, the other diffused layer of the fourth NMOS transistor and the other diffused layer of the third PMOS transistor being formed in a manner to adjoin directly to form a diffused layer region integrated.

A power source wiring and a grounding wiring may be arranged around the basic cell in a manner to be held in common with adjacent cells, at least one of two PMOS diffused layers which do not adjoin NMOS transistor diffused layer directly being arranged so as to be capable of being connected with a power source wiring through a contact directly and at least one of two NMOS diffused layers which do not adjoin PMOS diffused layer directly being arranged so as to be capable of being connected with a grounding wiring through a contact directly.

The semiconductor device may be provided with cell blocks that the basic cells are arranged into a plurality of matrix shapes, wherein the cell blocks are arranged, in the direction of the x-axis, so that the basic cells adjoining each other becomes linear symmetry each other in relation to the boundary of the cells and are arranged, in the direction of the y-axis, so that the basic cells adjoining each other becomes spot symmetry each other in relation to a midpoint of the boundary of the cells.

BRIEF DESCRIPTION OF THE DRAWINGS

FIG. 1A is a layout view of a diffused layer and a gate of a basic cell which is a first conventional example and is applicable to a semi-custom system using a bulk CMOS technology;

FIG. 1B is a schematic view for showing a direction of the basic cell shown in FIG. 1A;

FIG. 2 is a view that, omitting a layout of an inside of the cell, four pieces of a basic cell of the first conventional example are arranged and the layout of the power source wiring, the grounding wiring, the through-holes for the wiring and well contacts are performed;

DETAILED DESCRIPTION OF THE PREFERRED EMBODIMENT

Figure 3B:
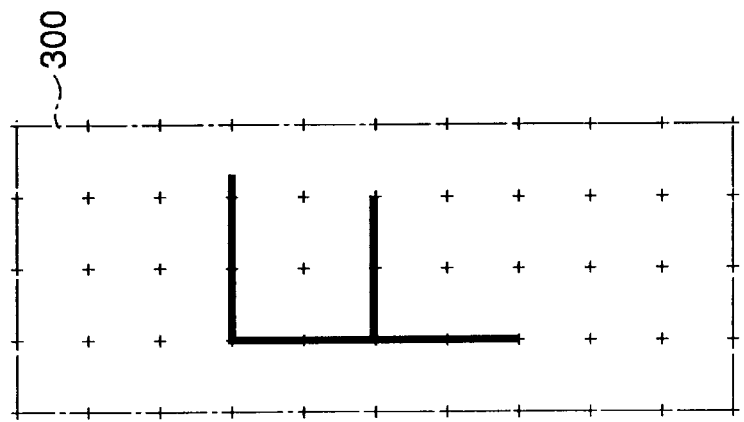
FIG. 3B is a schematic view for showing a direction of the basic cell shown in FIG. 3A.

Referring to FIGS. 1A through 4, description is, at first made about conventional examples of a prior art in order to facilitate an understanding of the present invention.

FIG. 1A is a layout view of the basic cell of a conventional example constituted by two P-channel MOS transistors (hereinafter referred to as a PMOS) used in the semi-custom system and two N-channel MOS transistors (hereinafter referred to as a NMOS). FIG. 1B is a schematic view for showing a direction of the basic cell at arranging this basic cell. FIG. 2 is a drawing where the aforesaid basic cells are arranged in group of one row and four columns repeatedly. In the basic cell achieved by a bulk CMOS technology, an element separation region (p+/n+ diffusion layer separation) of a certain width or more is provided between the PMOS and the NMOS. In addition, a well boundary is laid in the element separation region. A basic cell 200 shown in the drawing is constituted by two pieces of PMOS constituted by p+ diffused layers 2011, 2012 and 2018 and two pieces of gate polysilicon 2031 and 2032 and two pieces of NMOS constituted by n+ diffused layers 2021, 2022 and 2023 and two pieces of gate polysilicon 2033 and 2034. In addition, a well boundary 204 is laid between the p+ diffused layers 2011 to 2013 and the n+ diffused layers 2021 to 2023. Moreover, on the basic cell, in addition to the above-mentioned constitution, 1AL205 which becomes a wiring for power source is provided in the vertical direction to the gate polysilicon 2031 and 2032 of the PMOS side and 1AL206 which becomes a grounding wiring is provided in the vertical direction to the gate polysilicon 2033 and 2034 of the NMOS side. Furthermore, an n+ diffused layer 2201 and a p+ diffused layer 2101 for supplying an electric potential to the well or the substrate are provided. The n+ diffused layer 2201 is connected with the 1AL power source wiring 205 by a contact 211, and the 1AL power source wiring 205 is connected with a 2AL power source wiring 207 arranged in the vertical direction to the 1AL power source wiring 205 over the n+ diffused layer 2201 by a through-hole 221. The p+ diffused layer 2101 is connected with a 1AL power source wiring 206 by a contact 212, and the 1AL power source wiring 206 is connected with a 2AL power source wiring 208 arranged in the vertical direction to the 1AL power source wiring 206 over the p+ diffused layer 2101 by a through-hole 222. The basic cell 200 of FIGS. 1A, 1B and 2 constituted as described above has the square measure with eleven grids in row (the number of the grid on a design by CAD, all in a like manner, hereinafter) and four grids in column, that is, 44 grids in total. Since a space Sb between the p+ diffused layer 2011 to 2013 and the n+ diffused layers 2021 to 2023 determined by the element separation of the PMOS and the NMOS by the well is large, the basic cell constituted by the bulk CMOS technology becomes one of factors interfering the reduction of the cell square measure.

As a method for solving the above-mentioned problem of the bulk CMOS technology, the SOI•CMOS technology is proposed, as mentioned in the preamble of the instant specification. In the SOI•CMOS technology, since the PMOS and the NMOS become separable by the isolation film, it is not required to form the well so as to separate the p+ diffused layer and the n+ diffused layer. Therefore, a space between the p+ diffused layer and the n+ diffused layer can be arranged directly without being separated when the aforesaid diffused layers are in equipotential to each other. The space can be adjoined up to a minimum space specified by a process condition when the diffused layers are in different potential with respect to each other. This minimum space is a fraction of the Sb in the aforesaid bulk CMOS technology.

Figure 3A:
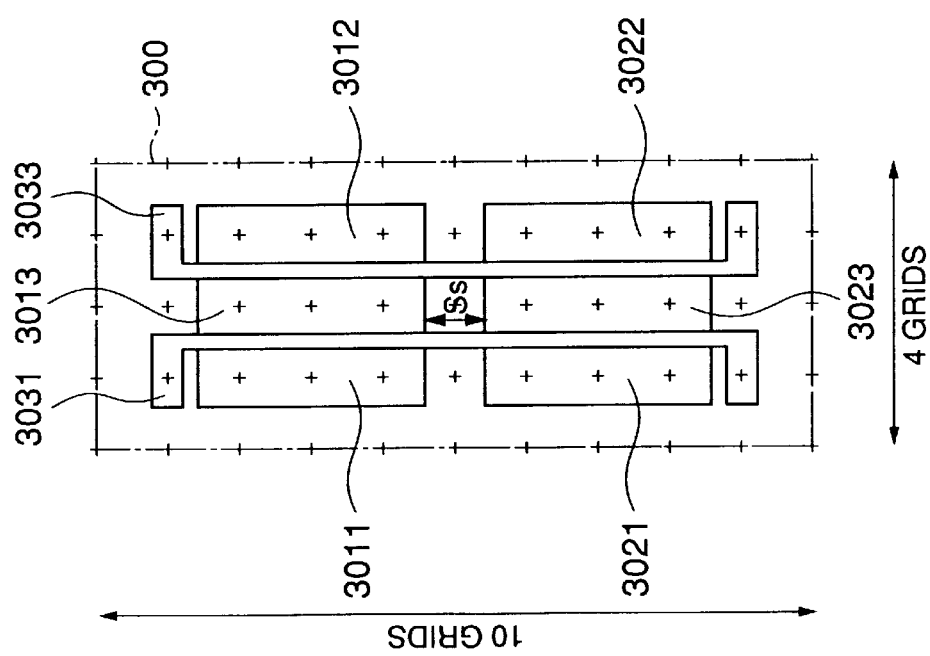
FIG. 3A is a layout view of a diffused layer and a gate of a basic cell which is a second conventional example and is applicable to a semi-custom system using the SOI•CMOS technology.
Figure 4:
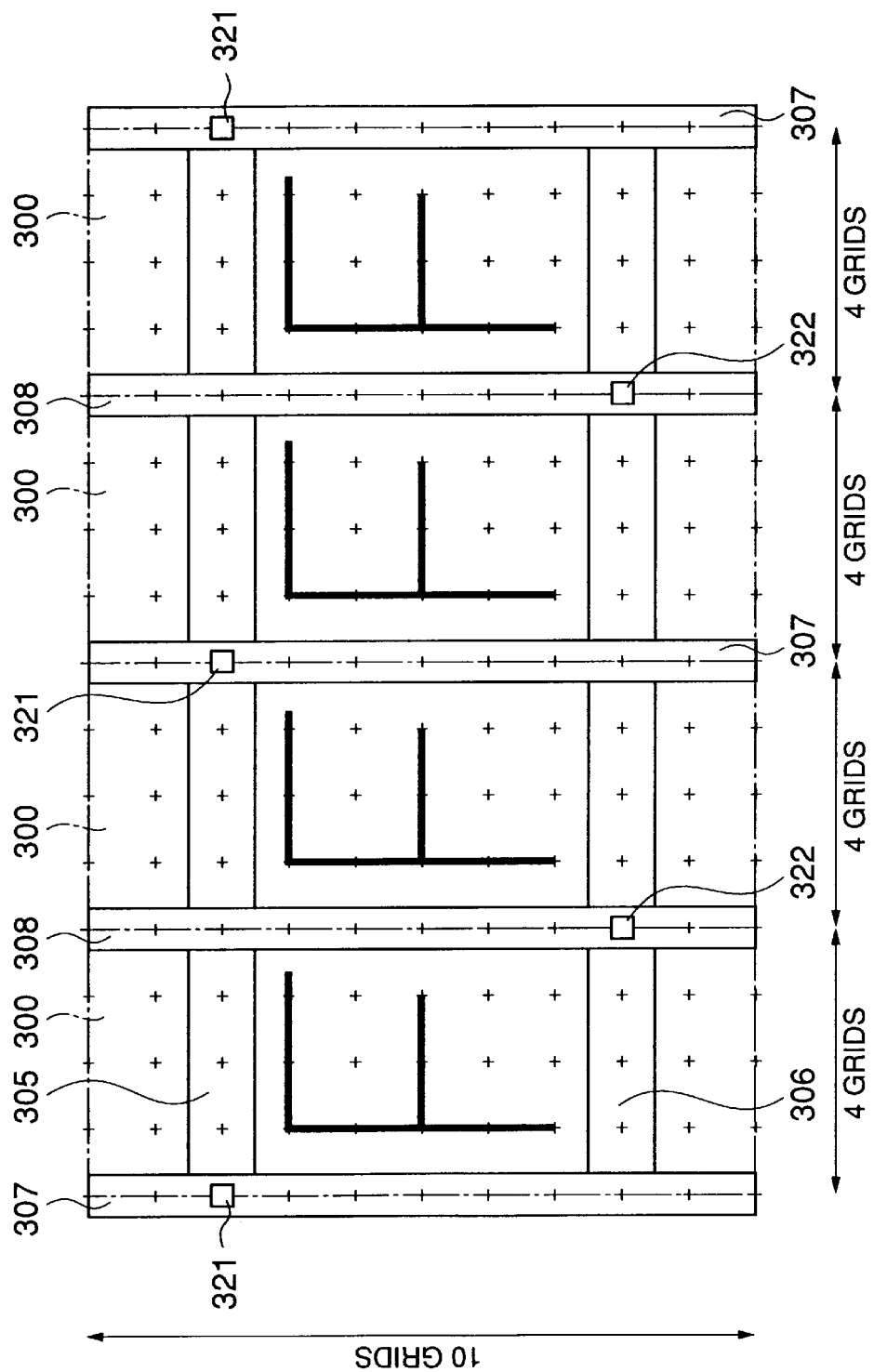
FIG. 4 is a view that, omitting a layout of an inside of the cell, four pieces of a basic cell of a second prior example are arranged and the layout of the power source wiring, the grounding wiring, the through-holes for the wiring and well contacts are performed.

Taking advantage of the feature of such SOI•CMOS technology, the basic cells as shown in FIGS. 3A, 3B and 4 are well known. FIG. 3A is a view for showing a layout of a diffused layer and a gate of a basic cell 300 while FIG. 3B is a schematic view for showing a direction of the basic cell at arranging this basic cell. FIG. 4 is a view in which four units of the basic cell of FIG. 3A are arranged and the power source wiring and the grounding wiring are added thereon.

The basic cell 300 as shown in FIG. 3A is constituted by two pieces of PMOS and two pieces of NMOS, and the space between the p+ diffused layer 3011, 3012 and 3013 and the n+ diffused layer 3021, 3022 and 3023 can be set at Ss (<Sb) which is specified by the process condition where the aforesaid diffused layers are in different potential with respect to each other. As a result, the basic cell 300 in FIG. 3A is minimized by the same amount of one grid in the longitudinal direction, compared with the case of the bulk CMOS. Accordingly, the square measure can be reduced by approximately 10%.

In the layout of the prior basic cell using the SOI•CMOS technology shown in FIGS. 3A, 3B and 4, the element separation region is inevitably laid between the p+ diffused layer and the n+ diffused layer. Therefore, it can not take advantage of the merit of the SOI•CMOS technology that a directly adjoining arrangement is possible, when both diffused layers are in equipotential to each other. As a result, it becomes difficult to reduce the square measure of the basic cell and the basic circuit cell furthermore.

Now, description will proceed to a semiconductor device according to a preferred embodiment of the present invention.

Herein, description is made as regards a concept and a function of the present invention.

In the present invention, a semiconductor device is formed on a principal surface of a semiconductor substrate provided with a silicon/isolation film structure and a basic cell constituting an internal circuit of this semiconductor device is constituted by two pieces of PMOS and two pieces of NMOS, when a side of the semiconductor device is defined as the direction of the x-axis, a side of the direction at the right angle to this side is defined as the direction of the y-axis and the direction of a gate width (W) of the PMOS and the NMOS is defined as the direction of the y-axis, the two pieces of PMOS and two pieces of NMOS are arranged in a row in the direction of the x-axis in order of a first arrangement of a first PMOS, a second PMOS, a first NMOS and a second NMOS or in order of a second arrangement of a third NMOS, a fourth NMOS, a third PMOS and a fourth PMOS, and when being the order of the first arrangement, the other diffused layer of the second PMOS and the other diffused layer of the first NMOS are formed in a manner to adjoin directly to form a diffused layer region integrated and when being the order of the second arrangement, the other diffused layer of the fourth NMOS and the other diffused layer of the third PMOS are formed in a manner to adjoining directly to form a diffused layer region integrated.

The square measure of the diffused layer can be minimized and the square measure can be reduced by forming the diffused layers of a portion on which the FMOS and the NMOS adjoin in a manner to make the diffused layers adjoin directly. Moreover, by arranging the power source wiring and the grounding wiring on the periphery of the cell, even though using a small basic cell, a region capable of wiring can be kept within the cell sufficiently, whereby the wiring never becomes difficult.

Next, referring to FIGS. 5A through 8B, description proceeds to a semiconductor device according to a preferred embodiment of the present invention.

Figure 5A:
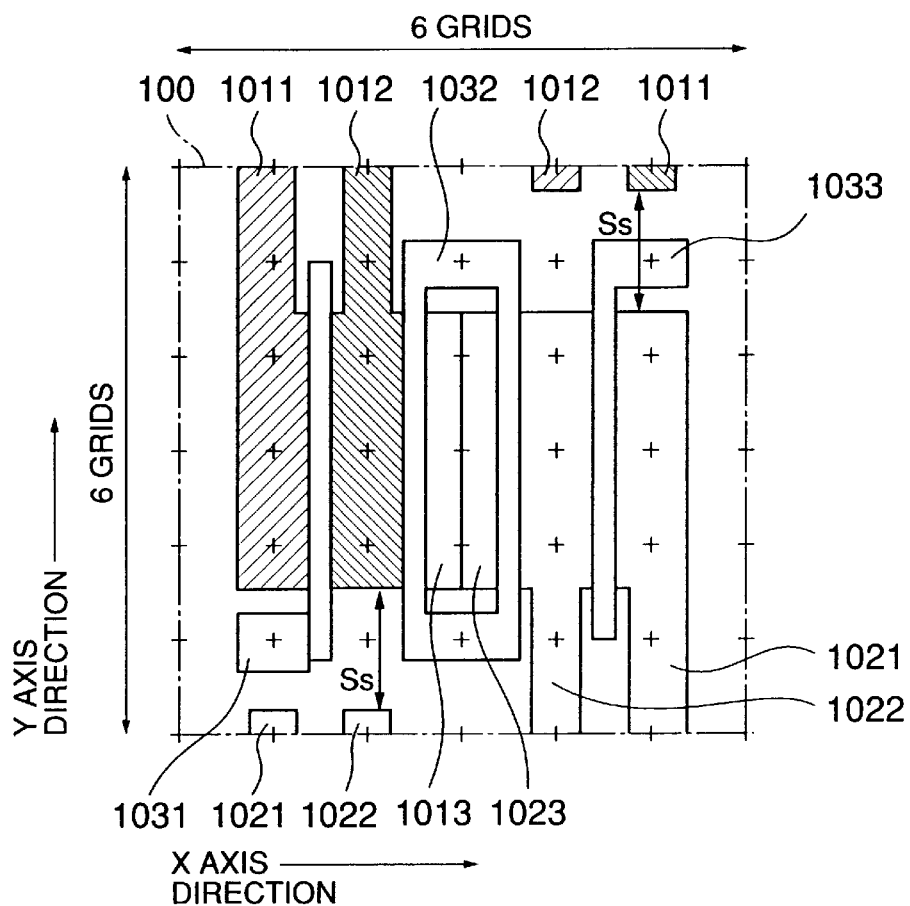
FIG. 5A are layout views of a diffused layer of a basic cell and a gate array in a semiconductor device according to a preferred embodiment of the present invention.
Figure 5B:
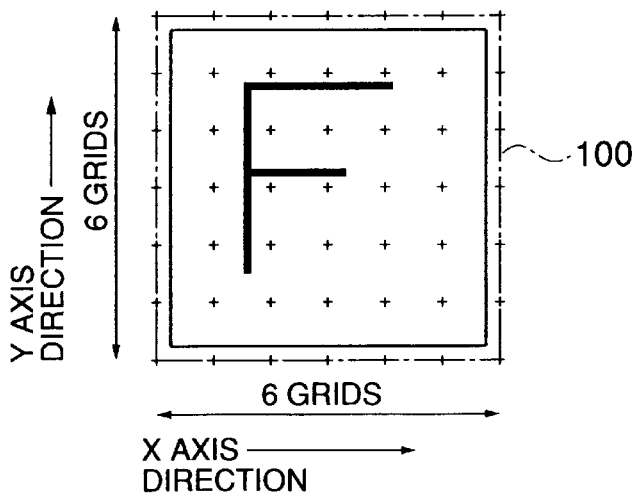
FIG. 5B is a schematic view for showing a direction of the basic cell shown in FIG. 5A.
Figure 6:
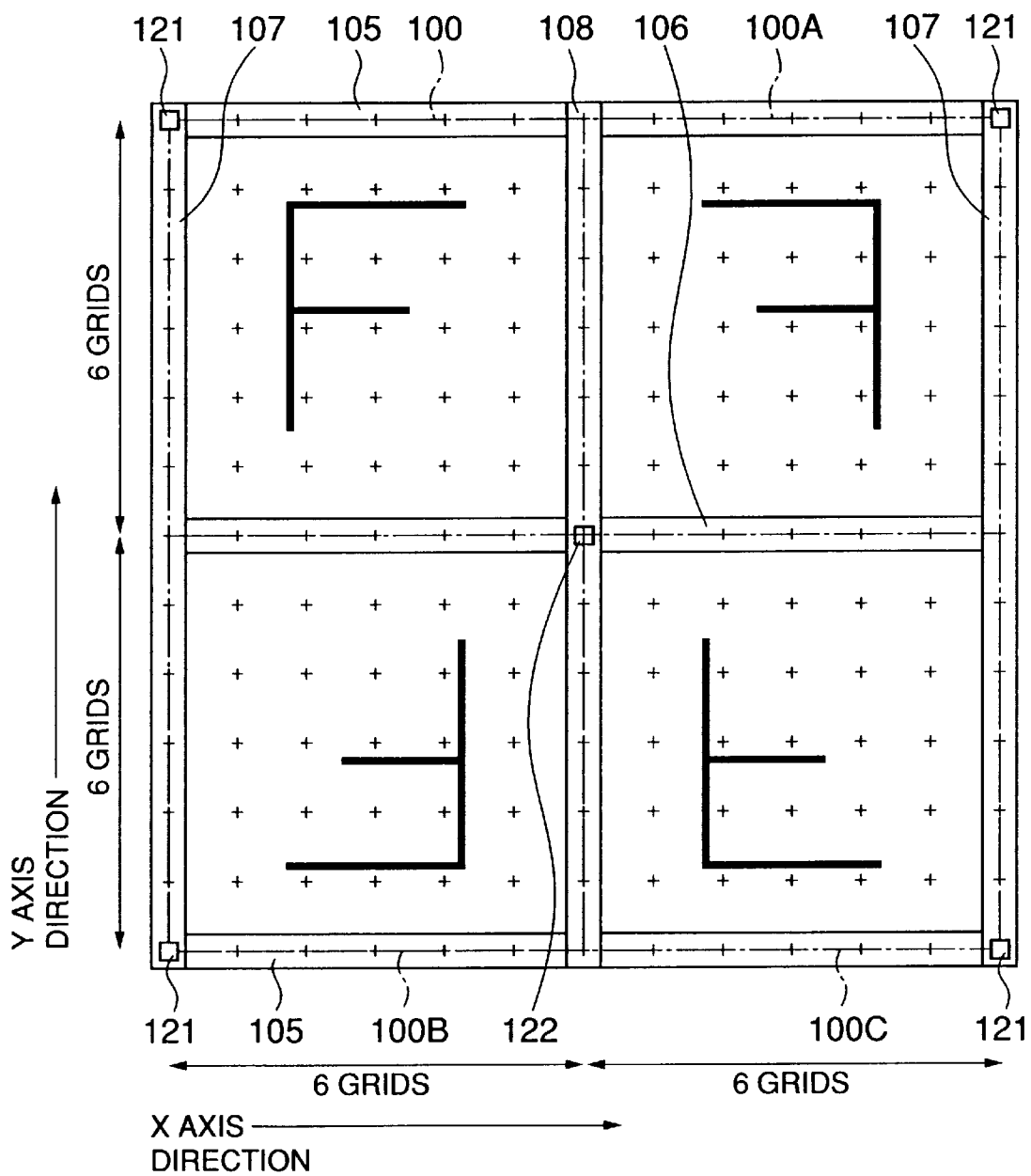
FIG. 6 is a view that, omitting a layout of an inside of the cell, the basic cells according to the preferred embodiment of the present invention are arranged in group of two rows and two columns repeatedly in accordance with a predetermined rule and the layout of the power source wiring and the grounding wiring and through-holes for these wiring are performed.

FIG. 5A is a view showing a diffused layer and a layout of a gate of a basic cell 100 according to the preferred embodiment of the present invention while FIG. 5B is a schematic view for showing a direction of the basic cell at arranging this basic cell. FIG. 6 is a view for showing a situation where these basic cells 100 are arranged in group of two rows and two columns repeatedly in accordance with a predetermined rule and the power source wiring and the grounding wiring are formed in a manner to being held in common with the adjacent cells.

A basic cell 100 shown in FIG. 5B is constituted by two pieces of PMOS constituted by p+ diffused layers 1011 to 1013 and gate polysilicon 1031 and 1032 and two pieces of NMOS constituted by n+ diffused layers 1021 to 1023 and gate polysilicon 1032 and 1033, as illustrated in FIG. 5A. The two pieces of PMOS and the two pieces of NMOS are arranged in order of the PMOS, the. PMOS, the NMOS and the NMOS or the NMOS, the NMOS, the PMOS and the PMOS in a row. At this point of time, the p+ diffused layer 1013 and the n+ diffused layer 1023 being the diffused layer of one side of each of the FMOS and the NMOS are arranged in a manner to adjoin directly to be formed as a diffused layer region integrated. As a result, the square measures of the equipotential diffused layers are reduced from six grids of the total square measure of each of the p+ diffused layer 2013 and the n+ diffused layer 2023 in FIG. 1A or the p+ diffused layer 3013 and the n+ diffused layer 3023 in FIG. 3A to three grids of the total square measure of each of the p+ diffused layer 1013 and the n+ diffused layer 1023 in FIG. 5A.

In addition to the above-mentioned constitution, the basic cell 100 is provided with the power source wiring and the grounding wiring on four sides of the basic cell in a manner to being held in common with the adjacent cells. The power source wiring and the grounding wiring are arranged in the direction of the row of the MOS transistor in the basic cell as the 1AL power source wiring 105 and a 1AL grounding wiring 106 and in the vertical direction as a 2AL power source wiring 107 and a 2AL grounding wiring 108. Moreover, the diffused layer regions of the p+ diffused layer 1011 and 1012 are extended so that the 1AL power source wiring 105 passes over the diffused layer. In the same way, the diffused layer regions of the n+ diffused layer 1021 and 1022 are extended so that the 1AL power source wiring 106 passes over the diffused layer. By constituting as described above, it can be prevented that the region capable of 1AL wiring is reduced by a large amount in the inside of the basic cell 100.

When arranging the basic cell 100, the both cells adjoining each other are arranged repeatedly in a manner to reverse an alignment of four MOS transistors constituting the basic cell. That is, while the alignment of the constitution transistor relating to the both cells adjoining each other having the 2AL power source wiring 107 or the grounding wiring 108 as a boundary becomes the relationship of linear symmetry each other in relation to the boundary of the cells, the alignment of the constitution transistor relating to the both cells adjoining each other having the power source wiring 105 of 1AL or the grounding wiring 106 as a boundary becomes the relationship of spot symmetry each other in relation to a midpoint of the boundary of the cells. By arranging the basic cells as described above, a distance between the p+ diffused layer 1011 and the n+ diffused layer 1021 or the p+ diffused layer 1012 and the n+ diffused layer 1022 caused between the adjoining cells can be set at a space Ss being specified by the process condition, when the both diffused layers are in different potential each other.

A basic cell 100 shown in this drawing is constituted by the square measure with 36 grids of six grids in row and six grids in column. This becomes the square measure reduction of approximate 20% as compared to the basic cell of FIGS. 1A and 1B shown as the prior example by the bulk CMOS technology and approximate 10% as compared to the basic cell of FIGS. 3A and 3B being the prior example by the SOI•CMOS technology.

FIGS. 7A, 7B and 8A, 8B are views for showing examples that a basic gate circuit is constituted using the cell according to the invention.

Figure 7A:
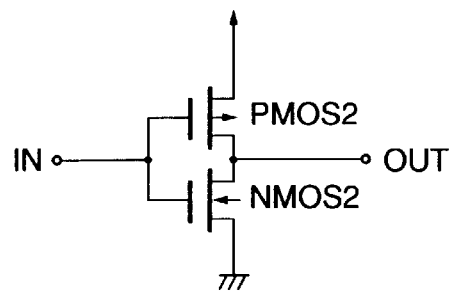
FIG. 7A is a circuit diagram of an inverter gate of which a layout is performed using the basic cell according to the preferred embodiment of the present invention.
Figure 7B:
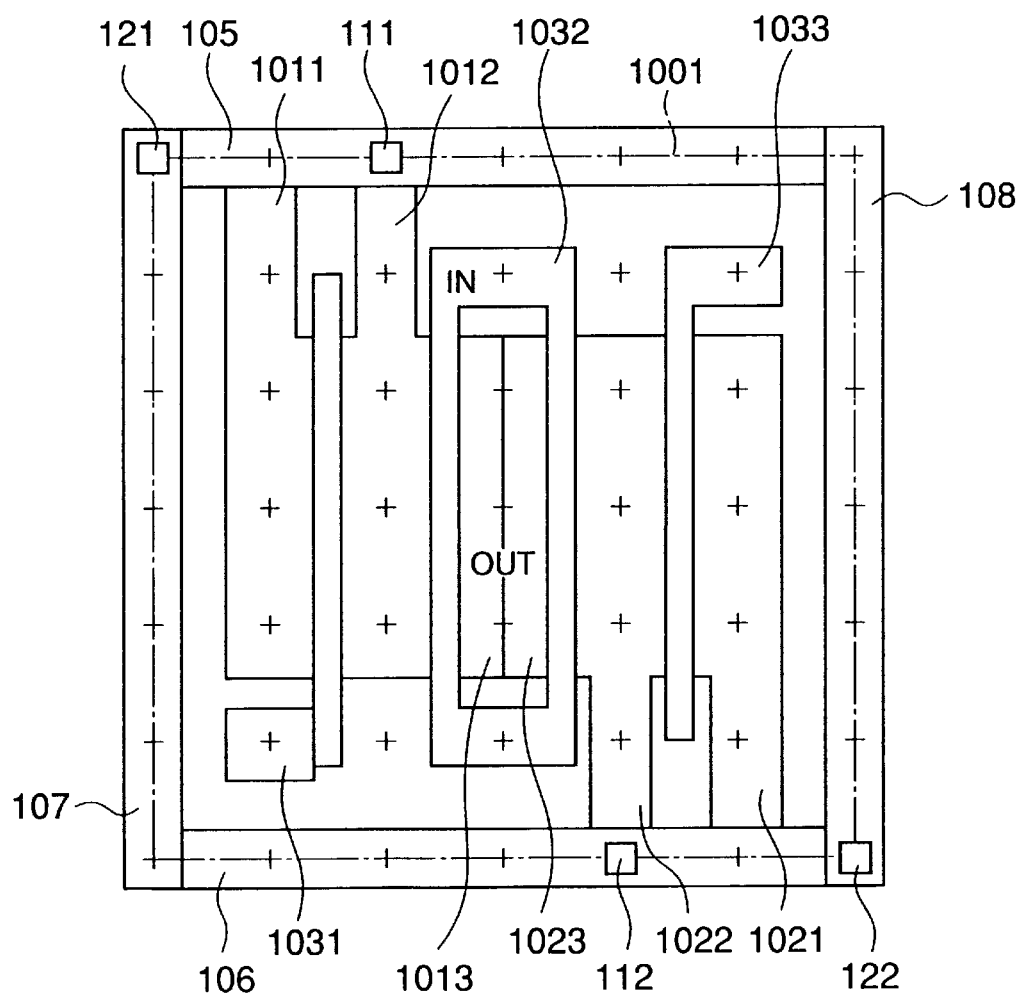
FIG. 7B is a layout view of the inverter gate of which the layout is performed using the basic cell according to the preferred embodiment of the present invention.

FIG. 7A is a circuit diagram of an inverter gate, and FIG. 7B is an inverter cell 1001 that this inverter gate is provided with two contacts 111 and 112 on the basis of the basic cell 100 shown in FIGS. 5A and 5B to be formed.

In PMOS 2 of the circuit diagram in FIG. 7A, the p+ diffused layer 1012 connected with the power source wiring 105 by contact 111 corresponds to the source, the p+ diffused layer 1013 to the drain and polysilicon 1032 to the gate respectively. On the other hand, In PMOS 2, the p+ diffused layer 1022 connected with the grounding wiring 106 by contact 112 corresponds to the source, the p+ diffused layer 1023 to the drain and polysilicon 1032 to the gate respectively. By constituting the pattern as described above, the p+ diffused layer 1013 and the n+ diffused layer 1023 which become an output node of the inverter gate are equipotential at all time, whereby it becomes possible to respond to the diffused layer region integrated and it becomes not required to provide the internal wiring in the inverter gate cell 1001.

Figure 8A:
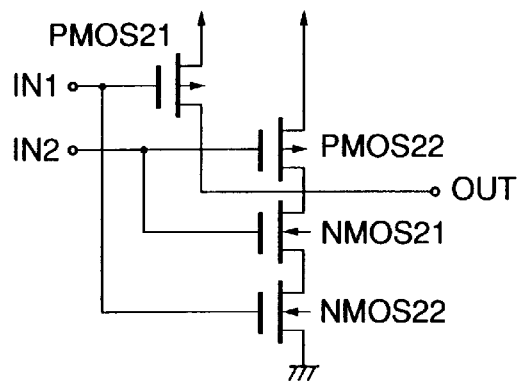
FIG. 8A is a circuit diagram of an inverter gate of which a layout of a two-input NAND gate is performed using the basic cell according to the preferred embodiment of the present invention.
Figure 8B:
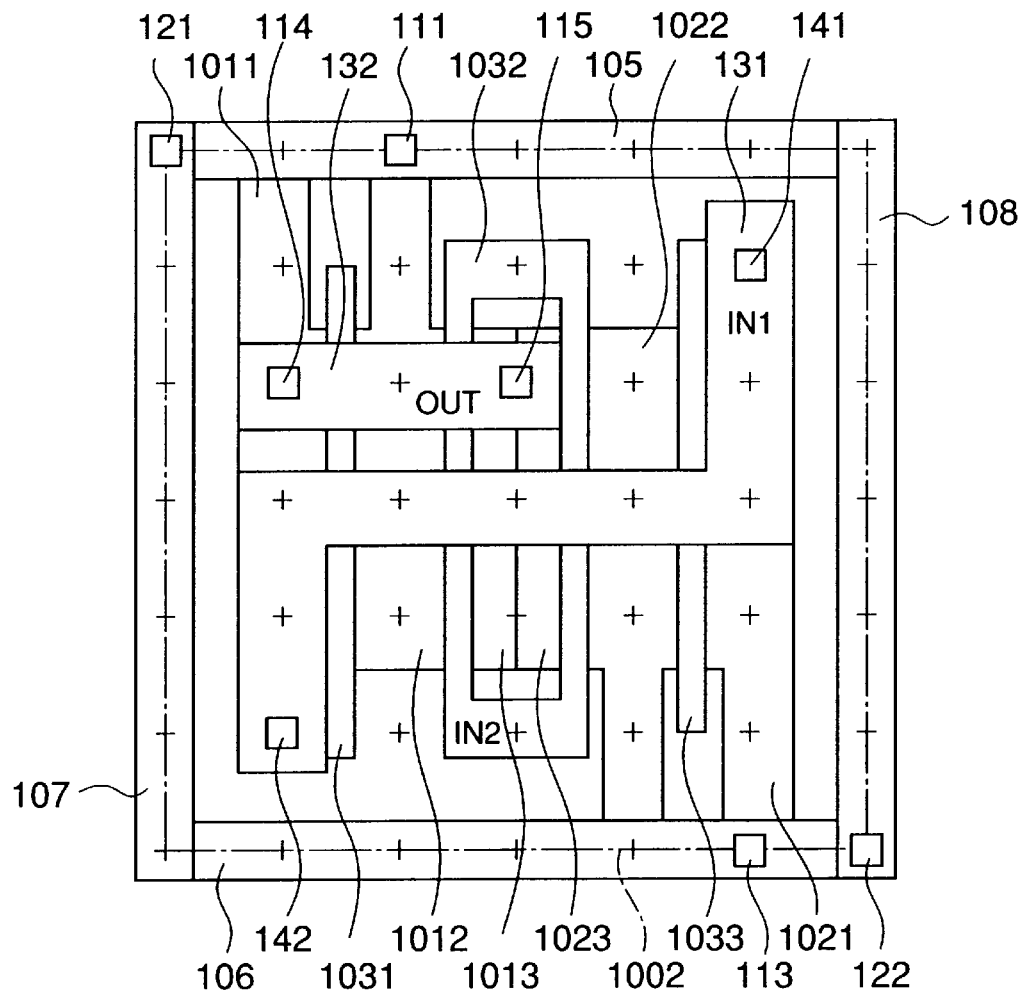
FIG. 8B is a layout view of the inverter gate of which the layout of the two-input NAND gate is performed using the basic cell according to the preferred embodiment of the present invention.

FIG. 8A is a circuit diagram of a two-input NAND gate, and FIG. 8B shows the two-input NAND gate cell 1002 that the two-input NAND gate is provided with six contacts 111, 113, 114, 115, 141 and 142 and two the 1AL wiring 131 and 132 on the basis of the basic cell 100 shown in FIGS. 5A and 5B to be formed into the layout.

In PMOS 21 and the PMOS 22 of the circuit diagram in FIG. 8A, the p+ diffused layer 1012 connected with the power source wiring 105 by contact 111 corresponds to the common source, the p+ diffused layer 1011 and 1013 to the drain and polysilicon 1031 and 1032 to the gates of IN1 and IN2 respectively. In PMOS 21 and the PMOS 22, the n+ diffused layer 1021 connected with the grounding wiring 106 by contact 113 corresponds to the source of the NMOS 22, the n+ diffused layer 1022 to the common diffused layer of the drain of the NMOS 22 and the source of the NMOS 21 and polysilicon 1082 and 1033 to the gates of IN1 and IN2 respectively. Moreover, the p+ diffused layer 1013 and the n+ diffused layer 1023 in the p+ diffused layer 1011, 1013 and the n+ diffused layer 1023 which are equipotential and become an output node of the two-input NAND gate are arranged in a manner to adjoin directly to be possible to respond to the diffused layer region integrated, and the p+ diffused layer 1011 is connected with said diffused layer region integrated constituted by the p+ diffused layer 1013 and the n+ diffused layer 1032 through contacts 114 and 115 by the 1AL wiring 132. The gate polysilicon 1031 and 1033 which become input node IN1 of the two-input NAND gate are connected through contacts 141 and 142 by the 1AL wiring 131.

As described above, in the inverter cell 1001 and the two-input NAND gate cell 1002 which becomes the basic cell, the pattern constitution which takes advantage of the SOI•CMOS technology can be performed by forming only the contacts 111 to 115, the 1AL wiring 131 and 182 on the basic cell 100 shown in FIG. 1 together. As a result, in the standard cell system also, the square measure reduction effect of the basic cell can be obtained in the same way as the gate array system.

This invention relates to a layout constitution of a basic cell or a basic circuit cell of a semiconductor device used the SOI•CMOS technology, and there is an effect that, by forming a diffused layer of a portion which a PMOS and a NMOS adjoin on a common region, the diffused layer square measure can be minimized, whereby the square measure reduction effect of the basic cell can be intend. Specifically, the square measure of a grid of the basic cell or the basic circuit cell becomes the reduction ratio of approximate 20% as compared to the prior example by the bulk CMOS technology and approximate 10% as compared to the prior example by the SOI•CMOS technology.

Moreover, there is an effect that, by arranging the power source wiring and the grounding wiring on the periphery of the cell, even though using a small basic cell, a sufficient region capable of wiring can be kept within the cell.

While this invention has thus far been described in conjunction with a preferred embodiment thereof, it will now be readily possible for one skilled in the art to put this invention into effect in various other manners.

What is claimed is:

1. A semiconductor device which is formed on a principal surface of a semiconductor substrate provided with a silicon/isolation film structure and which includes a basic cell constituting an internal circuit of said semiconductor device, comprising:

two PMOS transistors; and two NMOS transistors, when a side of said semiconductor device is defined as the direction of the x-axis, a side of the direction at the right angle to this side is defined as the direction of the y-axis and the direction of a gate width (W) of said PMOS and NMOS transistors is defined as the direction of the y-axis, said two PMOS transistors and said two NMOS transistors being arranged in a row in said direction of the x-axis in order of a first arrangement of a first PMOS transistor, a second PMOS transistor, a first NMOS transistor and a second NMOS transistor or in order of a second arrangement of a third NMOS transistor , a fourth NMOS transistor, a third PMOS transistor and a fourth PMOS transistor, and when being said order of the first arrangement, the one diffused layer of the second PMOS transistor and the one diffused layer of the first NMOS transistor being formed in a manner to adjoin directly to form a diffused layer region integrated, and when being said order of the second arrangement, the other diffused layer of the fourth NMOS transistor and the other diffused layer of the third PMOS transistor being formed in a manner to adjoin directly to form a diffused layer region integrated.

2. A semiconductor device as claimed in claim 1, wherein a power source wiring and a grounding wiring are arranged around said basic cell in a manner to be held in common with adjacent cells, at least one of two PMOS diffused layers which do not adjoin NMOS transistor diffused layer directly being arranged so as to be capable of being connected with a power source wiring through a contact directly and at least one of two NMOS diffused layers which do not adjoin PMOS diffused layer directly being arranged so as to be capable of being connected with a grounding wiring through a contact directly.

3. A semiconductor device as claimed in claim 1, provided with cell blocks that said basic cells are arranged into a plurality of matrix shapes, wherein said cell blocks are arranged, in the direction of the x-axis, so that said basic cells adjoining each other becomes linear symmetry each other in relation to the boundary of the cells and are arranged, in the direction of the y-axis, so that said basic cells adjoining each other becomes spot symmetry each other in relation to a midpoint of the boundary of the cells.

* * * * *